(12) United States Patent
Chuang et al.

(10) Patent No.: US 9,070,762 B2
(45) Date of Patent: *Jun. 30, 2015

(54) LEAD FRAME SUPPORT PLATE AND WINDOW CLAMP FOR WIRE BONDING MACHINES

(71) Applicant: ASM Technology Singapore Pte Ltd, Singapore (SG)

(72) Inventors: Phui Phoong Chuang, Johor Bahru (MY); Hasrul Bin Hasim, Johor (MY); Wan Azmi, Johor (MY); Siti Nurulhaida Bt. Ramlan, Johor (MY); Ka Shing Kwan, Singapore (SG); Ting Yu He, Singapore (SG); Jun Wan, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/246,199

(22) Filed: Apr. 7, 2014

(65) Prior Publication Data

US 2014/0217152 A1 Aug. 7, 2014

Related U.S. Application Data

(62) Division of application No. 13/548,323, filed on Jul. 13, 2012, now Pat. No. 8,752,751.

(51) Int. Cl.
*B23K 37/00* (2006.01)
*H01L 23/00* (2006.01)
(Continued)

(52) U.S. Cl.
CPC ............ *H01L 24/78* (2013.01); *Y10T 29/49826* (2015.01); *B23K 37/04* (2013.01); *B23K 20/004* (2013.01); *H01L 2224/78981* (2013.01); *H01L 24/85* (2013.01); *H01L 2224/78701* (2013.01); *H01L 2224/78704* (2013.01); *H01L 2924/00014* (2013.01)

(58) Field of Classification Search
None
See application file for complete search history.

(56) References Cited

U.S. PATENT DOCUMENTS 2,528,278 A 10/1950 Kendrick .................. 15/420
2,779,046 A 1/1957 Queirolo .................. 15/310
(Continued)

FOREIGN PATENT DOCUMENTS

CN 201272020 Y 7/2009
JP 01-274440 A 11/1989
(Continued)

OTHER PUBLICATIONS

Derwent-Acc-No. 2009-P03985 which corresponds to KR-2009098462A (published 2009).

*Primary Examiner* — Kiley Stoner
(74) *Attorney, Agent, or Firm* — Ostrolenk Faber LLP (57) ABSTRACT

A lead frame support plate 200 and a window clamp 400 for wire bonding machines are disclosed herein. In a described embodiment, the lead frame support plate 200 includes a network of suction grooves 218 provided on a support surface 212, each suction groove 218 being arranged to be in fluid communication with at least a vacuum hole 216 to enable a suction force to be created, in response to a vacuum force, along the network of suction grooves for holding a lead frame against the support surface. A window clamp 400 having slots for compensating deformation of the window clamp and a method of fabricating the lead frame support plate are also disclosed.

7 Claims, 11 Drawing Sheets

(51) Int. Cl.
*B23K 37/04* (2006.01)
*B23K 20/00* (2006.01)

(56) References Cited

U.S. PATENT DOCUMENTS

| | | | | |
|---|---|---|---|---|
| 2,782,574 | A | 2/1957 | Copold | 451/388 |
| 2,912,918 | A | 11/1959 | Mead | 454/66 |
| 3,652,075 | A | 3/1972 | Thompson | 269/21 |
| 4,324,487 | A | 4/1982 | Nishihama | 355/73 |
| 4,436,295 | A | 3/1984 | Wey et al. | 269/21 |
| 4,493,072 | A | 1/1985 | Shibata | 369/271.1 |
| 4,603,867 | A | 8/1986 | Babb et al. | 279/3 |
| 4,790,897 | A | 12/1988 | Long | 156/350 |
| 4,795,518 | A | 1/1989 | Meinel et al. | 156/285 |
| 5,322,207 | A * | 6/1994 | Fogal et al. | 228/180.5 |
| 5,405,123 | A | 4/1995 | Mielenz | 269/21 |
| 5,611,478 | A * | 3/1997 | Asanasavest | 228/110.1 |
| 5,622,304 | A * | 4/1997 | Sato | 228/44.7 |
| 5,954,842 | A * | 9/1999 | Fogal et al. | 29/25.01 |
| 6,051,067 | A | 4/2000 | Mou et al. | 118/500 |
| 6,105,846 | A * | 8/2000 | Evers et al. | 228/4.5 |
| 6,126,059 | A | 10/2000 | MacKay et al. | 228/9 |
| 6,164,633 | A | 12/2000 | Mulligan et al. | 269/21 |
| 6,176,652 | B1 | 1/2001 | Tsai et al. | 408/46 |
| 6,386,191 | B1 | 5/2002 | Yoshimura et al. | 125/35 |
| 6,422,548 | B1 | 7/2002 | Baber et al. | 269/21 |
| 6,464,790 | B1 | 10/2002 | Sherstinsky et al. | 118/715 |
| 6,524,351 | B2 | 2/2003 | Ohta | 29/25.01 |
| 6,651,868 | B2 * | 11/2003 | Kawamura | 228/49.5 |
| 6,764,258 | B1 | 7/2004 | Akre | 409/219 |
| 7,438,286 | B2 | 10/2008 | Umahashi et al. | 269/21 |
| 7,905,471 | B2 | 3/2011 | Garcia et al. | 269/21 |
| 2001/0051000 | A1 * | 12/2001 | Kim et al. | 382/151 |
| 2001/0054640 | A1 | 12/2001 | Takahashi | 228/180.5 |
| 2002/0125303 | A1 | 9/2002 | Tokunaga et al. | 228/180.22 |
| 2003/0075849 | A1 | 4/2003 | Choi | 269/21 |
| 2004/0038498 | A1 | 2/2004 | Ozono et al. | 438/464 |
| 2004/0065720 | A1 * | 4/2004 | Wong et al. | 228/219 |
| 2005/0067462 | A1 * | 3/2005 | Balon | 228/4.5 |
| 2005/0161488 | A1 * | 7/2005 | Duan et al. | 228/42 |
| 2005/0263566 | A1 * | 12/2005 | Su | 228/44.3 |
| 2006/0011701 | A1 | 1/2006 | Duan et al. | 228/44.7 |
| 2010/0301534 | A1 | 12/2010 | Im | 269/21 |
| 2011/0073635 | A1 * | 3/2011 | Gillotti et al. | 228/4.5 |
| 2012/0024089 | A1 * | 2/2012 | Couey et al. | 73/865.8 |

FOREIGN PATENT DOCUMENTS

| | | | |
|---|---|---|---|
| JP | 05-285763 A | | 11/1993 |
| JP | 2003-246042 A | | 9/2003 |
| JP | 2004-269166 A | | 9/2004 |
| JP | KR-2009-010318 U | | 10/2009 |
| KR | 2007002893 A | * | 1/2007 |
| KR | 101113847 B1 | * | 2/2012 |
| WO | WO 9210336 A2 | | 6/1992 |

* cited by examiner

LEAD FRAME SUPPORT PLATE AND WINDOW CLAMP FOR WIRE BONDING MACHINES

CROSS-REFERENCE TO RELATED APPLICATIONS

The present application is a divisional under 37 C.F.R. §1.53(b) of prior application Ser. No. 13/548,323, filed Jul. 13, 2012, the contents of which are incorporated herein by reference.

BACKGROUND AND FIELD

This invention relates to a lead frame support plate and window clamp for wire bonding machines.

Figure 1:
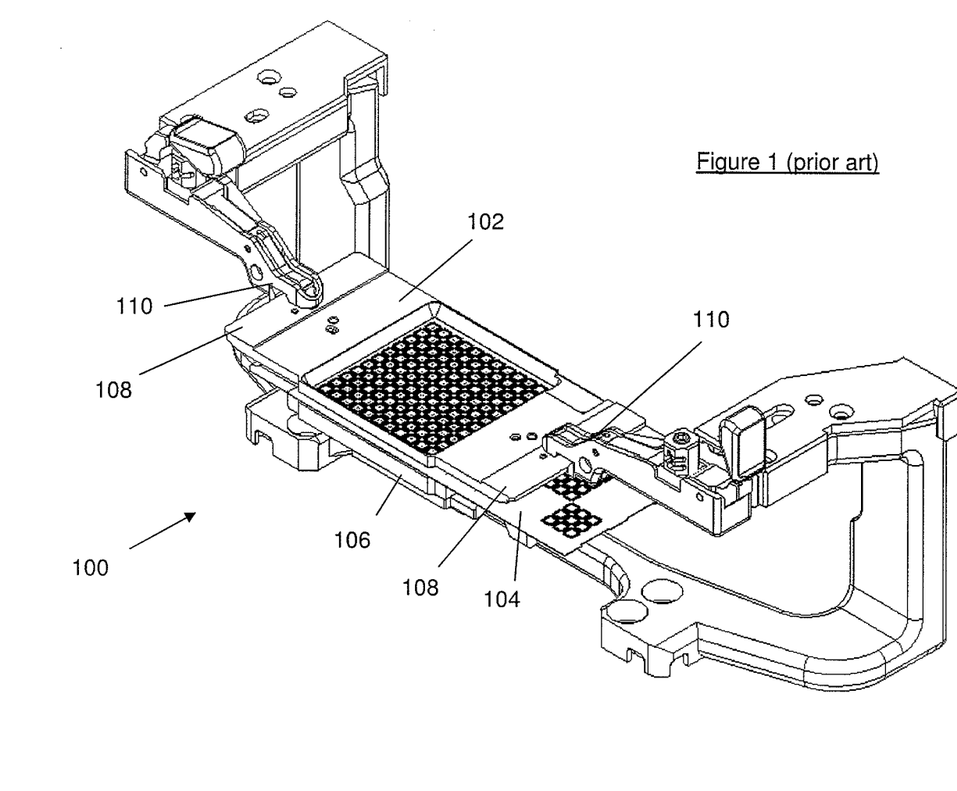
FIG. 1 shows part of a wire bonding machine having a conventional window clamp and conventional lead frame support plate, including window clamp holders.

To ensure proper and accurate wire bonding, a lead frame needs to be held in place with respect to a wire bonding machine and FIG. 1 illustrates a conventional approach. FIG. 1 shows part of a wire bonding machine 100 comprising a window clamp 102 placed over a strip of lead frame 104 and a lead frame support plate 106 for supporting the strip of lead frame 104. The window clamp 102 includes two support sections 108 which are held by corresponding window clamp holders 110 for applying a clamping force to the window clamp 102.

Figure 2:
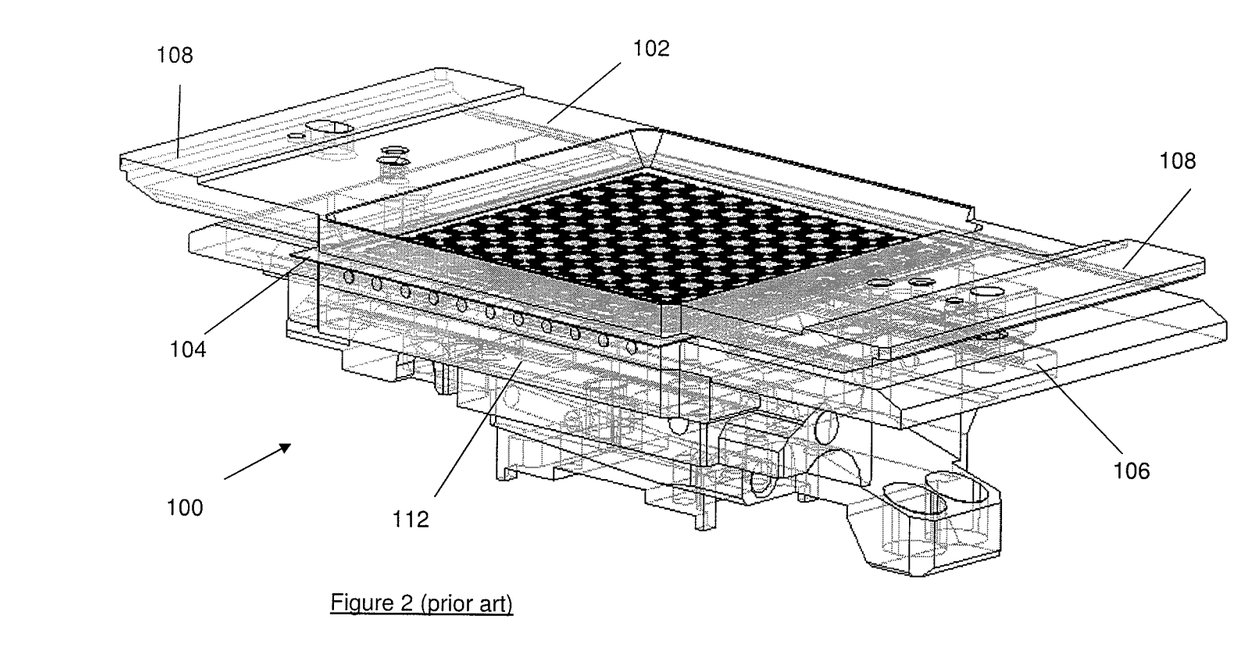
FIG. 2 is an enlarged side perspective view of the part of the wire bonding machine of FIG. 1 (without showing the window clamp holders)

FIG. 2 is an enlarged side perspective view of the part of the wire bonding machine 100 of FIG. 1 without showing the window clamp holders 110. The wire bonding machine further includes a heater block 112 for heating the lead frame support plate 106 and thus, the strip of lead frame 104 during the wire bonding process.

Figure 3:
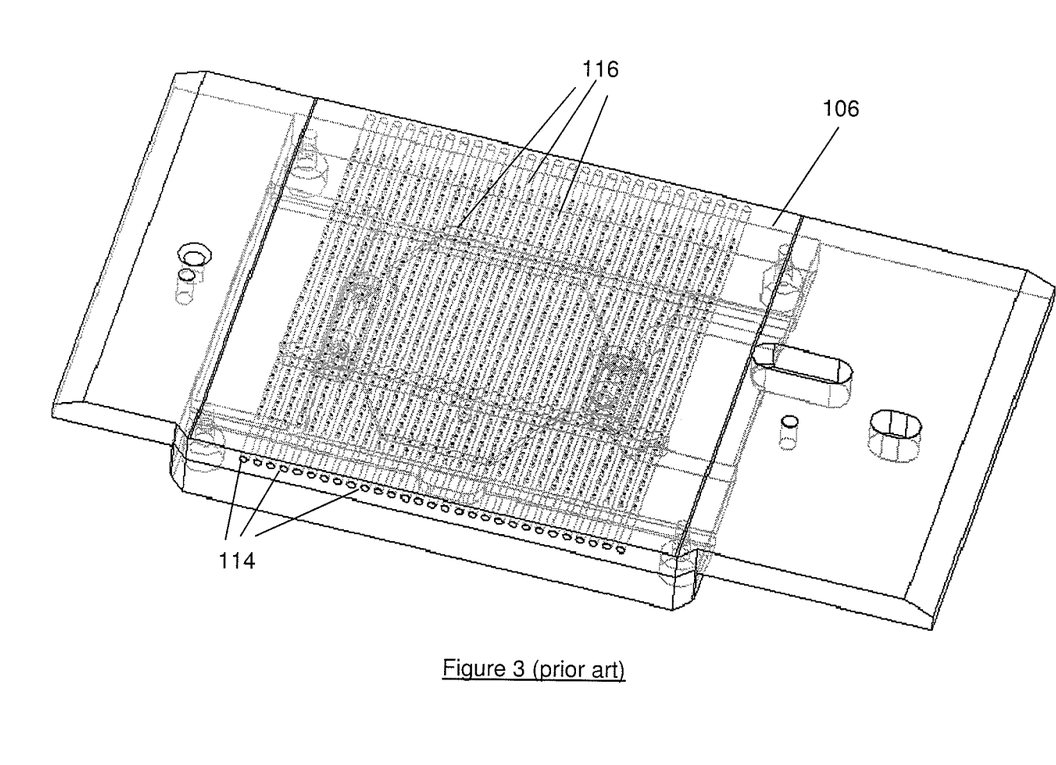
FIG. 3 is a perspective view of the conventional lead frame support plate of FIG. 2.

FIG. 3 is a perspective view of the lead frame support plate 106 of FIG. 2 which includes a series of elongate side bores 114 and a multiplicity of micro-holes 116 (normally more than 1000 micro-holes 116) across a major part of the lead frame support plate 106. The micro-holes 116 are in fluid communication with corresponding side bores 114 to create a network of air channels. When the side bores 114 are sealed up and a vacuum force is applied at the base of the lead frame support plate 106, a balanced suction force is created via the micro-holes 116 at the top surface of the lead frame support plate 106 to maintain the position of the strip of lead frame 104 during the wire bonding process. However, forming of the micro-holes 114 is an extremely time-consuming process.

Figure 4:
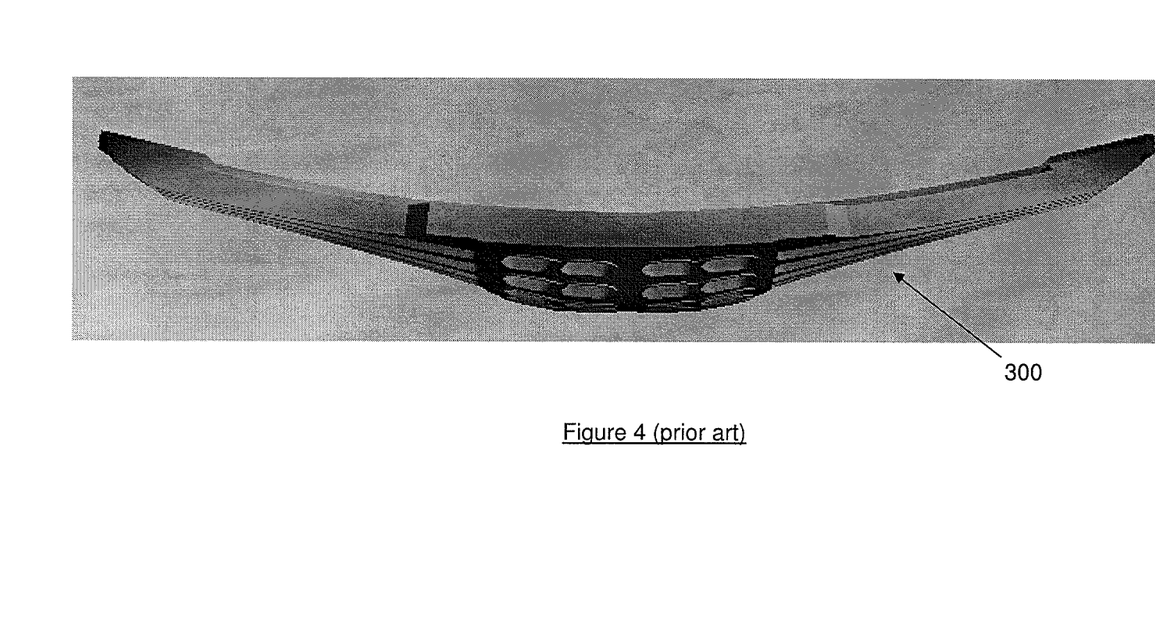
FIG. 4 shows effects of uneven heat distribution and clamping force to a window clamp as experienced by the window clamp of FIG. 2.

Further, referring to the arrangement illustrated in FIG. 2, it has been found that with the lead frame support plate 106 and the strip of lead frames 104 heated to a high temperature (for example, 200.degree. C.), the window clamp 102 is subjected to uneven heat distribution because the window clamp's lower surface which is in contact with the strip of lead frames 104 would have a higher temperature than the window clamp's upper surface since the upper surface is exposed. This uneven heat distribution together with the clamping force asserted by the window clamp holders 110 would cause the window clamp 102 to deform or warp. FIG. 4 shows an exemplary window clamp 300 which has deformed due to the uneven heat distribution. Such deformation would result in loose contact of the window clamp with leads of a lead frame resulting in floating leads or pads due to an insufficient clamping force therebetween. The bonding quality would thus be affected.

It is an object of the present invention to provide a lead frame support plate and window clamp which addresses at least one of the disadvantages of the prior art and/or to provide the public with a useful choice.

SUMMARY

In accordance with a first aspect, there is provided a lead frame support plate for a wire bonding machine; the lead frame support plate comprising a support surface for supporting a lead frame; an array of vacuum holes through which a vacuum force is to be applied; a network of suction grooves provided on the support surface, each suction groove being arranged to be in fluid communication with at least a said vacuum hole to enable a suction force to be created, in response to the vacuum force, along the network of suction grooves for holding the lead frame against the support surface.

An advantage of the described embodiment is that with the suction grooves, fabricating time of the lead frame support plate is greatly reduced and yet the suction grooves are able to achieve a balanced suction force on the support surface for holding the lead frame.

Preferably, the network of suction grooves includes a combination of linear and diagonal suction grooves. The suction grooves may be hemispheric and may have a maximum depth of about 0.026 mm. Preferably, the lead frame support plate further comprises a series of side bores extending between a first edge to a second edge of the support plate's body; the series of side bores arranged to intersect with respective vacuum holes.

According to a second aspect, there is provided a method of fabricating a lead frame support plate for a wire bonding machine, the lead frame support plate comprising a body having a support surface for supporting a lead frame and an array of vacuum holes through which a vacuum force is to be applied, the method comprising forming a network of suction grooves on the support surface with each suction groove being in fluid communication with at least a said vacuum hole to enable a suction force to be created, in response to the vacuum force, along the network of suction grooves for holding the lead frame against the support surface.

With such a fabrication method, the number of vacuum holes which needs to be formed is greatly reduced since a balanced vacuum force for holding the lead frame is provided by the network of suction grooves.

The method may also comprise forming the array of vacuum holes. Preferably, the method may further comprise forming a series of side bores which extends between a first edge to a second edge of the support plate's body; wherein the series of side bores are arranged to intersect with respective vacuum holes.

In a third aspect, there is provided a window clamp for a wire bonding machine, comprising an array of wire bonding windows having corresponding apertures configured to register with respective semiconductor dies, the array of wire bonding windows having two furthermost windows along a longitudinal axis; and a pair of slots disposed on each side of the array, each slot having an elongate portion defined by a first end and a second end, the first and the second ends extending at least between the apertures of the two furthermost windows.

An advantage of the described embodiment is that with pair of slots, it is possible to compensate for deformation of the window clamp caused by uneven heat distribution and clamping force asserted to sides of the window clamp during wire bonding. This thus achieves a more effective clamping of leads of a lead frame by the window clamp.

Preferably, each slot is generally C-shape with arm portions extending respectively from the first and second ends and generally orthogonal to the elongate portion. This configuration has been found to be more effective in compensating for deformation or warpage of the window clamp.

The first and second ends may extend to farthest edges of the apertures of the two furthermost windows. Preferably, the array of wire bonding windows includes a plurality of rows of windows, and wherein a first row and a last row of the plurality of rows respectively includes the two furthermost windows.

The apertures and the corresponding wire bonding windows may be of the same size. Alternatively, the size of the wire bonding windows is greater than the corresponding apertures.

The lead frame support frame of the first aspect and the window clamp of the second aspect may form part of a wire bonding machine independently or used together.

It should be appreciated that features relating to one aspect may also be applicable to the other aspects.

BRIEF DESCRIPTION OF THE DRAWINGS

Examples of the invention will now be described with reference to the accompanying drawings, in which:

FIG. 6 includes FIGS. 6a and 6b in which

FIG. 8 includes FIGS. 8a and 8b in which

DETAILED DESCRIPTION OF PREFERRED EMBODIMENT

Figure 5:
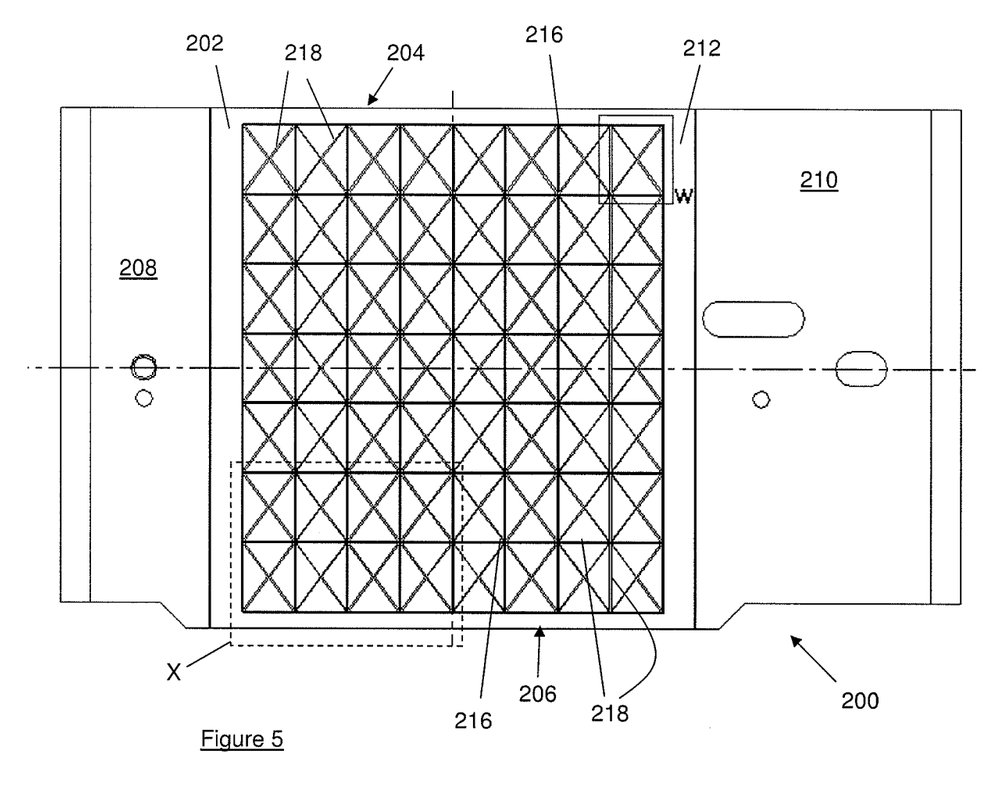
FIG. 5 is a top view of a lead frame support plate 200 having an array of vacuum holes in fluid communication with a network of suction grooves, according to a preferred embodiment.

FIG. 5 shows a lead frame support plate 200 of a preferred embodiment of the present invention. The lead frame support plate 200 includes a generally rectangular body 202 having first and second edges 204, 206 and side sections 208, 210 which define a boundary for a support surface 212 and a bottom surface 214 (see FIG. 8a). Size of the support surface 212 is adapted to accommodate or support a strip of lead frames similar to what is shown in FIGS. 1 and 2.

A series of side bores (not shown) of diameters about 1.0 mm-1.5 mm are formed using an endmill similar to what is illustrated in FIG. 3. The elongate side bores extend through the body 202 from the first edge 204 to the second edge 206, and the number of side bores are fewer than that illustrated in FIG. 3, for reasons which will be apparent later. The side bores may not only be vertical ones and diagonal side bores are also envisaged.

Next, an array of vacuum holes 216 are created which are through holes of diameter of about 0.15 mm extending from the support surface 212 to the bottom surface 214 and which intersects the side bores to form a network of air channels (not shown). The vacuum holes 216 of the array are regularly spaced and evenly spread over the support surface 212 and this is shown more clearly in FIG. 7.

Figure 6A:
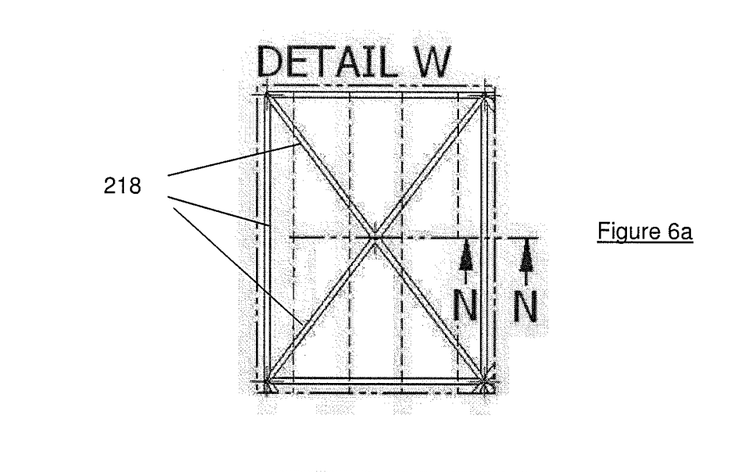
FIG. 6a is an enlarged view of Detail W of FIG. 5.
Figure 6B:
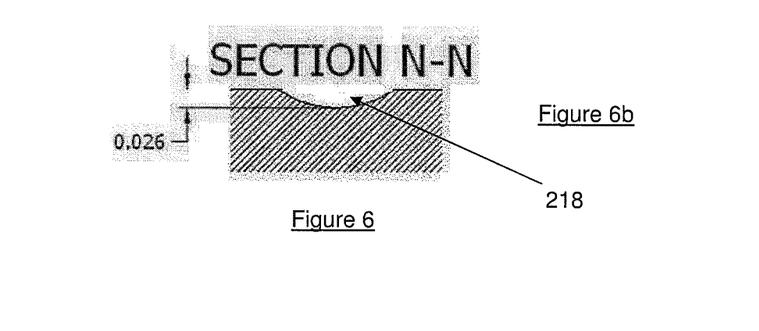
FIG. 6b is an enlarged cross-sectional view of FIG. 6a in direction N-N.

A network of suction grooves 218 is next formed on the support surface 212 and each suction groove 218 is hemispheric and has a maximum depth of about 0.026 mm. Thus, in this embodiment, the suction grooves 218 may also be called "micro-grooves" due to its dimension. FIG. 6a is an enlarged view of Detail W of FIG. 5 to show the suction grooves 218 more clearly, and FIG. 6b is an enlarged cross-sectional view in the direction N-N of FIG. 6a.

Figure 7:
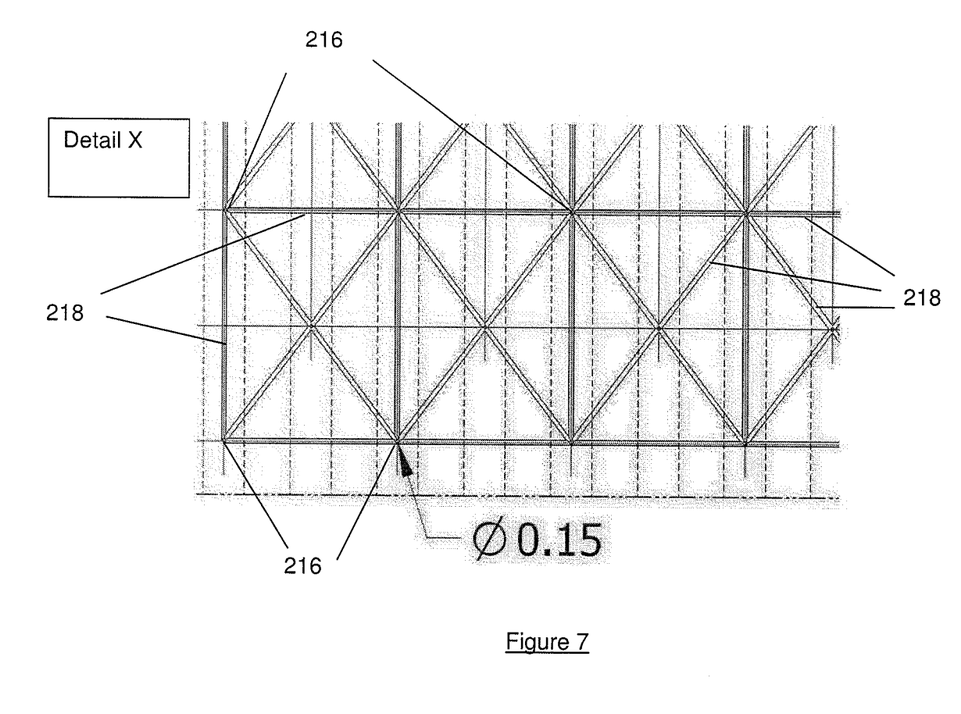
FIG. 7 is an enlarged view of Detail X of FIG. 5 to show the vacuum holes and the suction grooves more clearly.
Figure 8A:
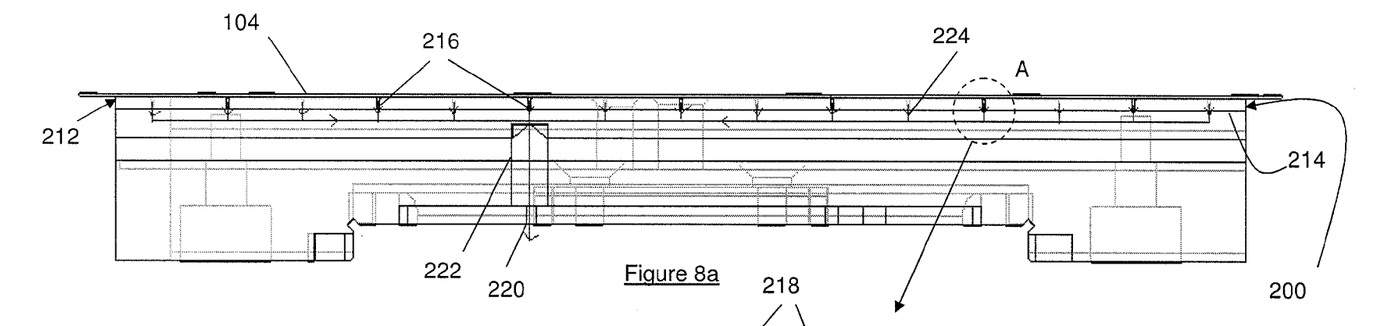
FIG. 8a is a side view of the lead frame support plate of FIG. 5 when used to support a strip of lead frame.
Figure 8B:
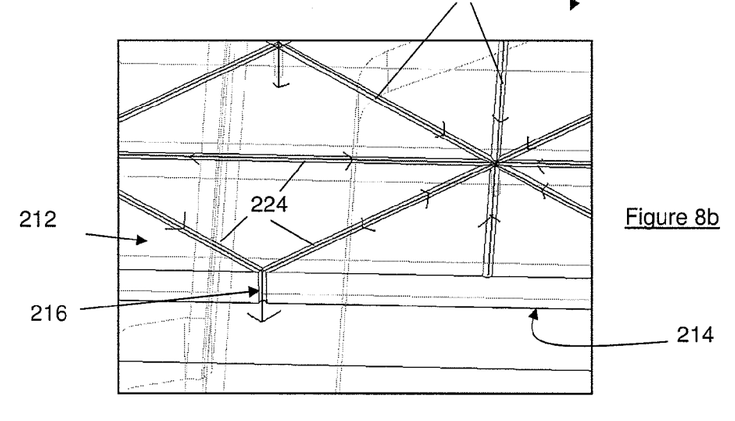
FIG. 8b is an enlarged view of portion A of FIG. 8a to illustrate air vacuum flow through the suction grooves.

Each suction groove 218 is elongate and extends linearly (i.e. vertically or horizontally) or diagonally to form a criss-cross network illustrated in FIG. 5, and each suction groove 218 is configured to be in fluid communication with at least one vacuum hole 216 and this is shown more clearly in FIG. 7. When a vacuum force is applied via the vacuum holes 216, this creates suction on the support surface 212 and specifically along the suction grooves 218 to create a linear suction force. FIG. 8 including FIGS. 8a and 8b illustrate the effects of the vacuum force when the lead frame support plate 200 is used during wire bonding. FIG. 8a is a side view of the lead frame support plate 200 of FIG. 5 arranged to support the strip of lead frame 104 shown in FIGS. 1 and 2. Similar to the prior arrangement of FIG. 2, the body 202 of the lead frame support plate 200 is arranged to transfer heat from a heat source to heat the strip of lead frame 104.

It would be appreciated that the suction grooves 218 create air gaps between the strip of lead frame 104 and the support surface 212 of the lead frame support plate 200 and when a vacuum force 220 is applied through a vacuum aperture 222, the vacuum force 220 draws or sucks out air linearly from the suction grooves 218 in the direction of arrows 224 (see FIG. 8b) to create a balanced vacuum holding force between the strip of lead frame 104 and the support surface 208. The direction of suction is from the support surface 212 to the bottom surface 214 via the suction grooves 218 and the vacuum holes 216 (i.e. through the network of air channels) and through the vacuum aperture 222. In this way, the strip of lead frame 104 is held stationary with reference to the support surface 208 and thus, the lead frame support plate 200 during the wire bonding.

With the use of suction grooves 218, the number of vacuum holes 216 needed to create a balanced vacuum force is far fewer than the micro-holes 116 in the prior support plate 106 of FIG. 3. As an example, for a similar size lead frame support plate, the number of vacuum holes 216 needed to create a balanced vacuum holding force on the support surface 212 may just be around 100, compared to 1000 micro-holes 116 required in the support plate 106 of FIG. 3. With the number of vacuum holes 216 reduced, this also reduces the number of end bores needed to create the network of air channels. As a result, this significantly reduces the time required for fabricating the support plate 200. Moreover, the use of the suction grooves 218 also enables the support plate 200 to handle different types of lead frames.

Figure 9:
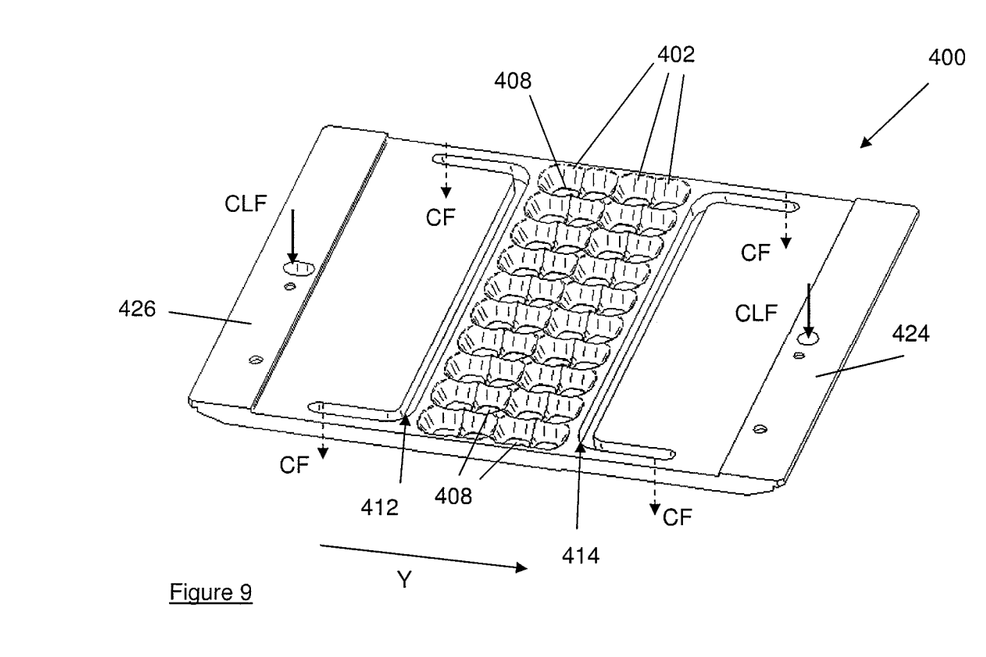
FIG. 9 is a perspective view of a window clamp according to the preferred embodiment.

FIG. 9 shows a window clamp 400 according to the preferred embodiment of the invention. The window clamp 400 is similar to the one 102 illustrated in FIG. 1 except that the window clamp 400 includes an array of wire bonding windows 402 having four columns 404 and ten rows 406. Each wire bonding window 402 includes a corresponding aperture 408 arranged to register with a semiconductor die for the wire bonding. In this embodiment, the size of the wire bonding window 402 is greater than the aperture 408 but it should be appreciated that this may vary depending on the type of window clamp. For example, the size of the wire bonding window 402 may be the same as the aperture 408.

The wire bonding windows 402 of each column 404 of the array are arranged along a respective longitudinal axis 410. The ten rows 406 include a first row 406a and a last row 406b and the wire bonding windows 402 along respective longitudinal axis in the first and last rows 406a, 406b are the furthermost wire bonding windows. Taking a first longitudinal axis 410a of the array as an example, the wire bonding window 402a in the first row 406a and the wire bonding window 402b in the last row 406b are considered the furthermost wire bonding windows 402a, 402b along the first longitudinal axis 410a.

Further, unlike the window clamp 102 of FIG. 1, the window clamp 400 includes a pair of slots 412, 414 for compensating thermal expansion of the window clamp. The width of each slot is about 3 mm. Each slot 412, 414 is generally C-shape and has an elongate portion 416, 418 having ends 417, 419 which extend at least between the apertures 408a, 408b of the two furthermost wire bonding windows 406a, 406b. In other words, the length of the elongate portion 416, 418 should be at least distance D of FIG. 10 which is the distance between the two nearest edges of the apertures 408a, 408b of the two furthermost wire bonding windows 402a, 402b along the first longitudinal axis 410a. In this way, the elongate portion would transverse the entire length of the wire bonding windows 406. The distance D may be about 70.5 mm.

Figure 10:
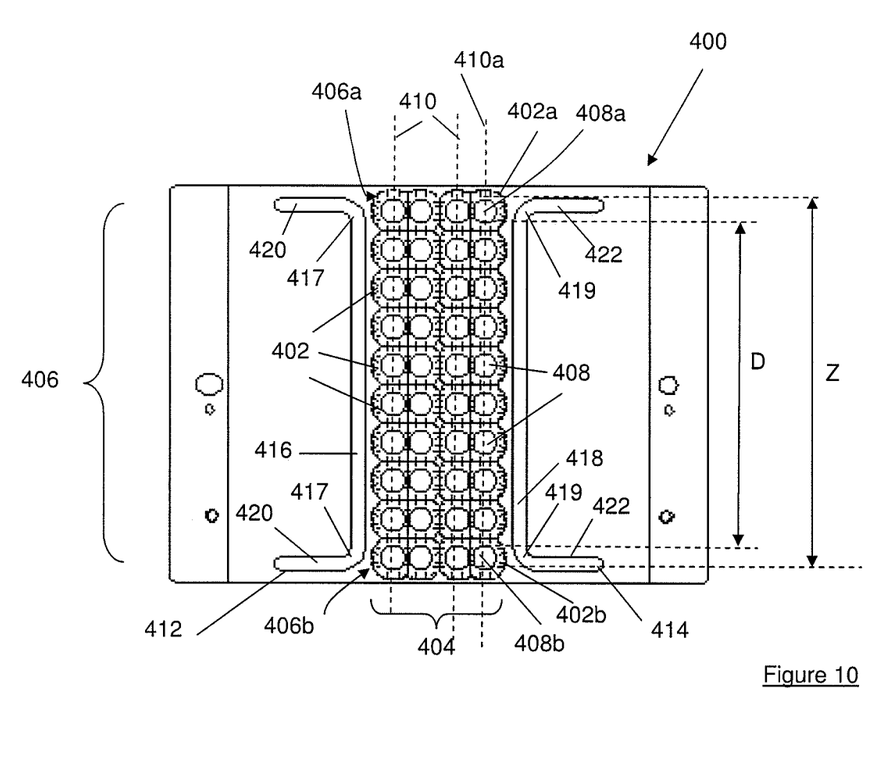
FIG. 10 is a top view of the window clamp of FIG. 9.

Preferably, the length of the elongate portion 416, 418 is not more than distance Z which is the two farthest edges of the apertures 408a, 408b of the two furthermost wire bonding windows 402a, 402b. The distance Z may be about 80.0 mm.

Each slot 412, 414 also includes two arm portions 420, 422 orthogonal to respective elongate portions 416, 418 and which extends away from the array of wire bonding windows 402 to form the C-shape. As it can be appreciated from FIG. 10, the arm portions 420, 422 of each slot 412, 414 extend in a direction opposite to each other.

When support sections 424, 26 of the window clamp 400 are held by window clamp holders 110, the applied clamping force creates component forces CF at the four corners of the arm portions 420, 422 of the respective slots 412, 414 as illustrated in FIG. 9 and clamping forces CLF at the support sections 424, 426. Since the support sections 424, 426 deform more in the Y direction, components of the clamping force CLF would force the window clamp 400 to counter the deformation shown in FIG. 4 and thus, the window clamp 400 would remain substantially flat.

With the window clamp 400 as proposed, clamping performance is improved and the leads of lead frames are clamped more firmly.

The described embodiments should not be construed as limitative. For example, other shapes and sizes of the lead frame support plate may be used and not necessary that shown in FIG. 5. Also, the size and pattern of the network of suction grooves 218 may be modified according to the type of lead frame strip. The diameters of the vacuum holes and the end bores may be varied according to application too.

Figure 11:
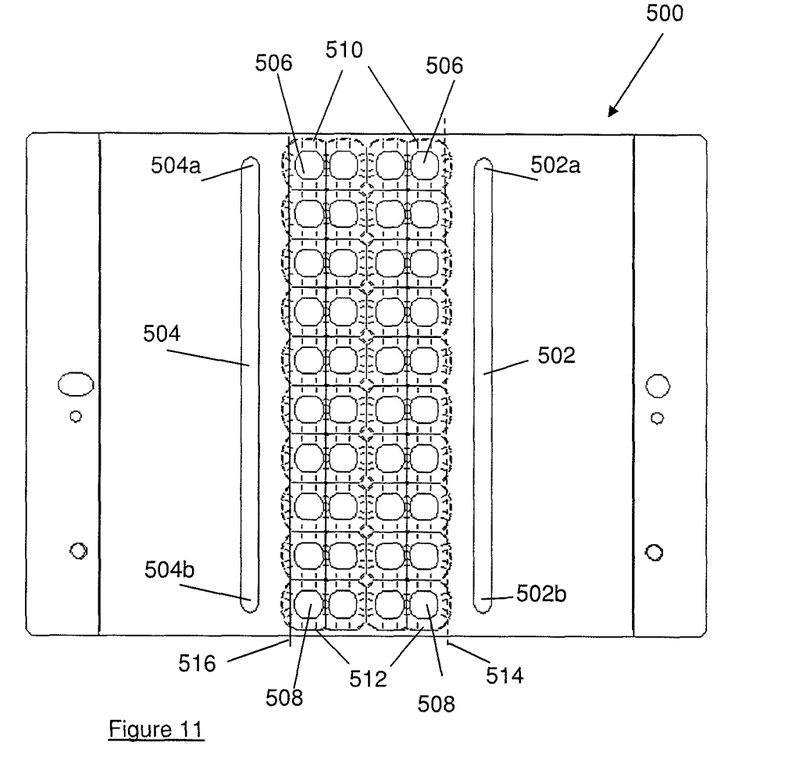
FIG. 11 shows a variation of the window clamp of FIG. 9.

The number and size of the wire bonding windows 402 of the window clamp may be varied too, depending on the type of window clamp. Further, the wire bonding windows 402 may not be arranged in straight lines as shown and other arrangements may be possible. Further, the size and shape of the slot 412, 414 may be varied too and FIG. 11 shows a variation 500 of the window clamp 400 of FIG. 10. In the window clamp 500 of FIG. 10, instead of C-shape slots, the window clamp 500 includes a pair of elongate slots 502, 504 with ends 502a, 502b, 504a, 504b that extend between respective apertures 506, 508 of the furthermost bonding windows 510, 512 along corresponding longitudinal axis 514, 516. Such slots 502, 504 may also help to compensate the deformation or warp but may not be as preferred as the C-shape slots 412, 414 of FIG. 10.

It should be appreciated that the lead frame support plate 200 and the window clamps 400, 500 in the described embodiment may be used independently of each other and need not necessary be used in the same wire bonding machine.

Having now fully described the invention, it should be apparent to one of ordinary skill in the art that many modifications can be made hereto without departing from the scope as claimed.

What is claimed is:

1. A window clamp for a wire bonding machine, the window clamp comprising:
    an array of wire bonding windows having corresponding apertures configured to register with respective semiconductor dies, the array of wire bonding windows having two furthermost windows along a longitudinal axis; and
    a pair of slots disposed on each side of the array, each slot having an elongate portion defined by a first end and a second end, the first and the second ends extending at least between the apertures of the two furthermost windows,
    wherein each slot further comprises arm portions extending respectively from the first and second ends, and the arm portions are generally orthogonal to the elongate portion.

2. A window clamp according to claim 1, wherein the first and second ends extend to farthest edges of the apertures of the two furthermost windows.

3. A window clamp according to claim 1, wherein the array of wire bonding windows includes a plurality of rows of windows, and wherein a first row and a last row of the plurality of rows respectively includes the two furthermost windows.

4. A window clamp according to claim 1, wherein the apertures and the corresponding wire bonding windows are the same size.

5. A window clamp according to claim 1, wherein the size of the wire bonding windows is greater than the corresponding apertures.

6. A wire bonding machine comprising a window clamp of claim 1.

7. A window clamp for a wire bonding machine, comprising
    an array of wire bonding windows having corresponding apertures configured to register with respective semiconductor dies, the array of wire bonding windows comprising two furthermost windows along a longitudinal axis; and a pair of slots disposed on each side of the array, each slot having an elongate portion defined by a first end and a second end, the first and the second ends extending at least between the apertures of the two furthermost windows, wherein each slot is generally C-shaped with arm portions extending respectively from the first and second ends and generally orthogonal to the elongate portion.

* * * * *